United States Patent
Yang et al.

(10) Patent No.: US 9,559,155 B2
(45) Date of Patent: Jan. 31, 2017

(54) ORGANIC LIGHT EMITTING DISPLAY DEVICE WITH SHORT-CIRCUIT PREVENTION

(71) Applicant: LG Display Co., Ltd., Seoul (KR)

(72) Inventors: In young Yang, Seoul (KR); Jong Sik Shim, Goyang-si (KR); Min Kyu Chang, Seoul (KR)

(73) Assignee: LG Display Co., Ltd., Seoul (KR)

(*) Notice: Subject to any disclaimer, the term of this patent is extended or adjusted under 35 U.S.C. 154(b) by 85 days.

(21) Appl. No.: 14/093,783

(22) Filed: Dec. 2, 2013

(65) Prior Publication Data
US 2015/0091786 A1    Apr. 2, 2015

(30) Foreign Application Priority Data
Oct. 2, 2013 (KR) .................. 10-2013-0118021

(51) Int. Cl.
*G09G 3/30* (2006.01)
*H01L 27/32* (2006.01)

(52) U.S. Cl.
CPC ......... *H01L 27/3265* (2013.01); *H01L 27/322* (2013.01); *H01L 27/3262* (2013.01)

(58) Field of Classification Search
CPC .............. H01L 27/322; H01L 51/5281; H01L 51/5284; H01L 33/08; H01L 33/16; H01L 51/06; H01L 33/62; H01L 51/5203; H01L 27/3265; H01L 27/3262; C03C 8/24; C03C 16/306
USPC .. 345/80–85, 204; 313/504, 503; 315/169.3; 257/44, 88, 72; 428/1.1
See application file for complete search history.

(56) References Cited

U.S. PATENT DOCUMENTS

| | | | |
|---|---|---|---|
| 6,515,428 B1* | 2/2003 | Yeh et al. | 315/169.3 |
| 2005/0074565 A1* | 4/2005 | Cok | B82Y 10/00 428/1.1 |
| 2007/0238218 A1* | 10/2007 | Teng et al. | 438/99 |
| 2008/0100202 A1* | 5/2008 | Cok | C23C 16/306 313/503 |
| 2008/0118743 A1* | 5/2008 | Lee et al. | 428/332 |
| 2008/0143247 A1* | 6/2008 | Kim | C03C 8/24 313/504 |
| 2008/0252201 A1* | 10/2008 | Pearce et al. | 313/504 |
| 2009/0108747 A1* | 4/2009 | Ishida et al. | 313/504 |
| 2010/0079361 A1* | 4/2010 | Lee et al. | 345/77 |
| 2010/0102313 A1* | 4/2010 | Miyairi et al. | 257/43 |
| 2011/0156063 A1* | 6/2011 | Lin et al. | 257/88 |
| 2012/0104405 A1* | 5/2012 | Choi | H01L 27/124 257/72 |
| 2013/0057523 A1* | 3/2013 | Omoto | 345/204 |

* cited by examiner

*Primary Examiner* — Johnathan Boyd
*Assistant Examiner* — James Nokham
(74) *Attorney, Agent, or Firm* — Fenwick & West LLP

(57) ABSTRACT

Disclosed is an organic light emitting display device. The organic light emitting display device includes a white organic light emitting diode (OLED) formed in an emission area of each of a plurality of sub-pixels, a driving thin film transistor (TFT) configured to supply a driving current to the white OLED, a storage capacitor configured to include a first terminal coupled to the driving TFT and a second terminal coupled to an anode electrode of the white OLED, and a color filter formed in the emission area. At least one of a top metal of the storage capacitor and a top metal of the driving TFT is formed to not overlap the color filter.

8 Claims, 7 Drawing Sheets

ORGANIC LIGHT EMITTING DISPLAY DEVICE WITH SHORT-CIRCUIT PREVENTION

CROSS-REFERENCE TO RELATED APPLICATIONS

This application claims the benefit of the Korean Patent Application No. 10-2013-0118021 filed on Oct. 2, 2013, which is hereby incorporated by reference as if fully set forth herein.

BACKGROUND

Field

The present disclosure relates to an organic light emitting display device in which a color filter and a top metal of a driving thin film transistor (TFT) are formed to not overlap each other in a structure where a plurality of the color filters are formed on a lower substrate, thereby preventing short-circuit between the driving TFT and a storage capacitor.

Discussion of the Related Art

With the spread of various portable electronic devices such as mobile terminals and notebook computers, the demand for display devices applied to portable electronic devices is increasing.

Examples of display devices include liquid crystal display (LCD) devices, plasma display panels (PDPs), field emission display (FED) devices, organic light emitting display devices, and others.

Display devices are easily manufactured due to advances in manufacturing technology and have benefits that include low power consumption, a high-quality image, and a large screen. Thus, the diversity of applications of these display devices is expanding.

Among such display devices, organic light emitting display devices self-emit light from an organic light emitting diode (OLED), and thus have a broader viewing angle, a better contrast, and better luminance than LCD devices. Also, it is easy to lighten and thin the organic light emitting display device. In addition, the organic light emitting display devices have a fast response time and low power consumption, and thus are attracting much attention as next-generation display devices.

Hereinafter, among various display devices, an organic light emitting display device will be described as an example.

FIG. 1 is a view schematically illustrating a pixel structure of a related art organic light emitting display device, and FIG. 2 is a cross-sectional view taken along line A1-A2 of FIG. 1 and a cross-sectional view taken along line A3-A4 of FIG. 1. In FIGS. 1 and 2, one green pixel among a plurality of red, green, and blue pixels is illustrated as an example.

Referring to FIGS. 1 and 2, a plurality of pixels are formed in a matrix type on a display panel, and one unit pixel is composed of red (R), green (G), and blue (B) sub-pixels (sub-pixels of three colors) or R, G, B, and white (W) sub-pixels (sub-pixels of four colors).

Each of the sub-pixels includes a driving circuit that drives the white OLED. The driving circuit includes a driving TFT 10 and a storage capacitor 20, which control emission of light from the white OLED, and a plurality of switching TFTs (not shown).

The driving TFT 10 and the plurality of switching TFTs (not shown) are formed in a dual-gate structure. In FIG. 2, a drain of the driving TFT 10 and the storage capacitor 20 are illustrated, but an active layer and a source electrode are not illustrated.

An overcoat layer for planarizing a substrate is formed on the driving TFT 10, the storage capacitor 20, and the color filter 30, and a bank defining an emission area is formed on the overcoat layer. An anode electrode 50 and the white OLED (not shown) are formed in the emission area of each sub-pixel, and a cathode electrode (not shown) is formed all over the substrate.

The white OLED emits white light from an organic material layer. In order to display a full-color image, a red color filter, a green color filter, and a blue color filter 30 are formed in each sub-pixel of a lower substrate (a TFT array substrate).

Here, a pigment of the color filter 30 contains a conductive material, and thus, an electrical resistance of the color filter 30 is low. Particularly, a pigment of the green color filter is a copper-containing compound (Cu-Phthalocyanine), and thus, a permittivity of the green color filter is high, causing a leakage current to electrically flow.

The drain of the driving TFT 10 and the storage capacitor 20 are formed adjacent to the color filter 30, a top metal 12 of the drain and a top metal 22 of the storage capacitor 20 are formed to overlap the color filter 30.

Therefore, the drain of the driving TFT 10 is short-circuited with the storage capacitor 20 by the green color filter.

FIG. 3 is a circuit diagram for describing a problem that the drain of the driving TFT 10 is short-circuited with the storage capacitor 20 by the color filter.

Referring to FIG. 3, even when the driving TFT 10 is floated, a leakage current flows from the storage capacitor 20 to the driving TFT 10 due to the color filter 30. For this reason, the OLED of the green sub-pixel emits light even during a non-emission period.

In an experiment in which the leakage current of the driving TFT 10 and the storage capacitor 20 caused by the color filter was measured, it was determined that the OLED excessively emits light due to the leakage current when a resistance of the color filter is equal to or less than 1 TΩ.

When the leakage current flows due to the green color filter having a low resistance, a gate-source voltage Vgs of the driving TFT 10 of the green sub-pixel is changed to 0 V with time. Under a condition in which a threshold voltage (Vth) of the driving TFT 10 is equal to or less than 0 V, when the gate-source voltage Vgs of the driving TFT 10 is 0 V, a current of several hundreds nA flows, and due to this, the OLED excessively emits light at luminance of several Nit or more.

SUMMARY

Accordingly, the present disclosure is directed to provide an organic light emitting display device that substantially obviates one or more problems due to limitations and disadvantages of the related art.

An aspect of the present disclosure is directed to provide an organic light emitting display device that prevents a driving TFT from being short-circuited with a storage capacitor by a color filter.

Another aspect of the present disclosure is directed to provide an organic light emitting display device that prevents an OLED from emitting light during a non-emission period.

In addition to the aforesaid objects of the present disclosure, other features and advantages of the present disclosure will be described below, but will be clearly understood by those skilled in the art from descriptions below.

To achieve these and other advantages as embodied and broadly described herein, there is provided an organic light emitting display device including: a white organic light emitting diode (OLED) formed in an emission area of each of a plurality of sub-pixels; a driving thin film transistor (TFT) configured to supply a driving current to the white OLED; a storage capacitor configured to include a first terminal, which is coupled to the driving TFT, and a second terminal coupled to an anode electrode of the white OLED; and a color filter formed in the emission area, wherein at least one of a top metal of the storage capacitor and a top metal of the driving TFT is formed to not overlap the color filter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the present disclosure and are incorporated in and constitute a part of this application, and illustrate embodiments together with the description. In the drawings.

DETAILED DESCRIPTION

Figure 1:
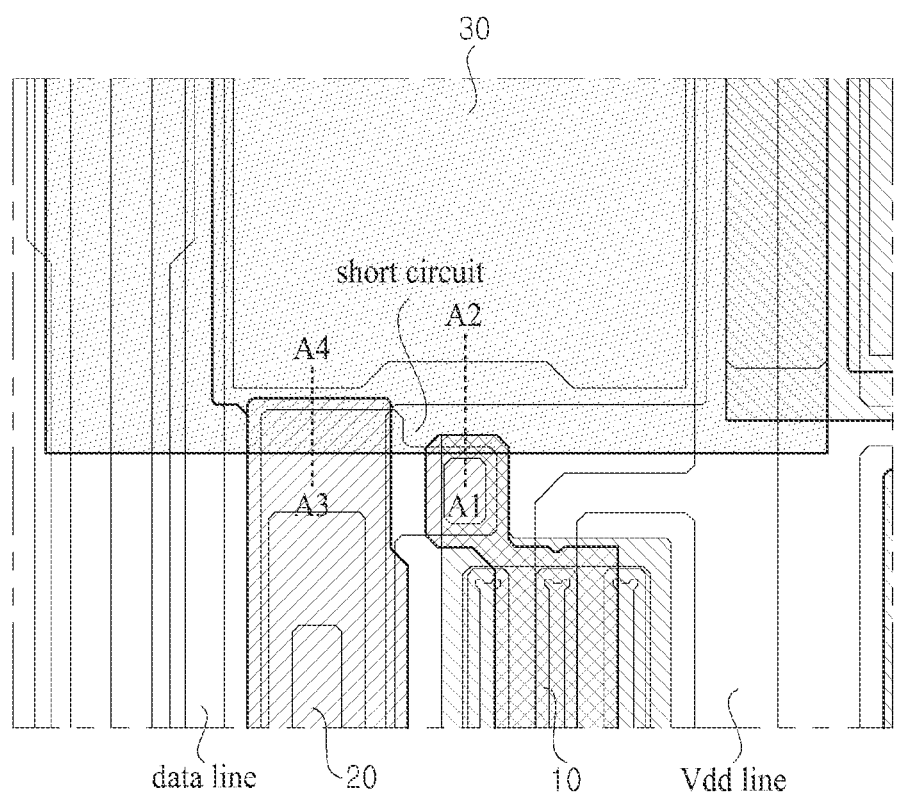
FIG. 1 is a view schematically illustrating a pixel structure of a related art organic light emitting display device.
Figure 2:
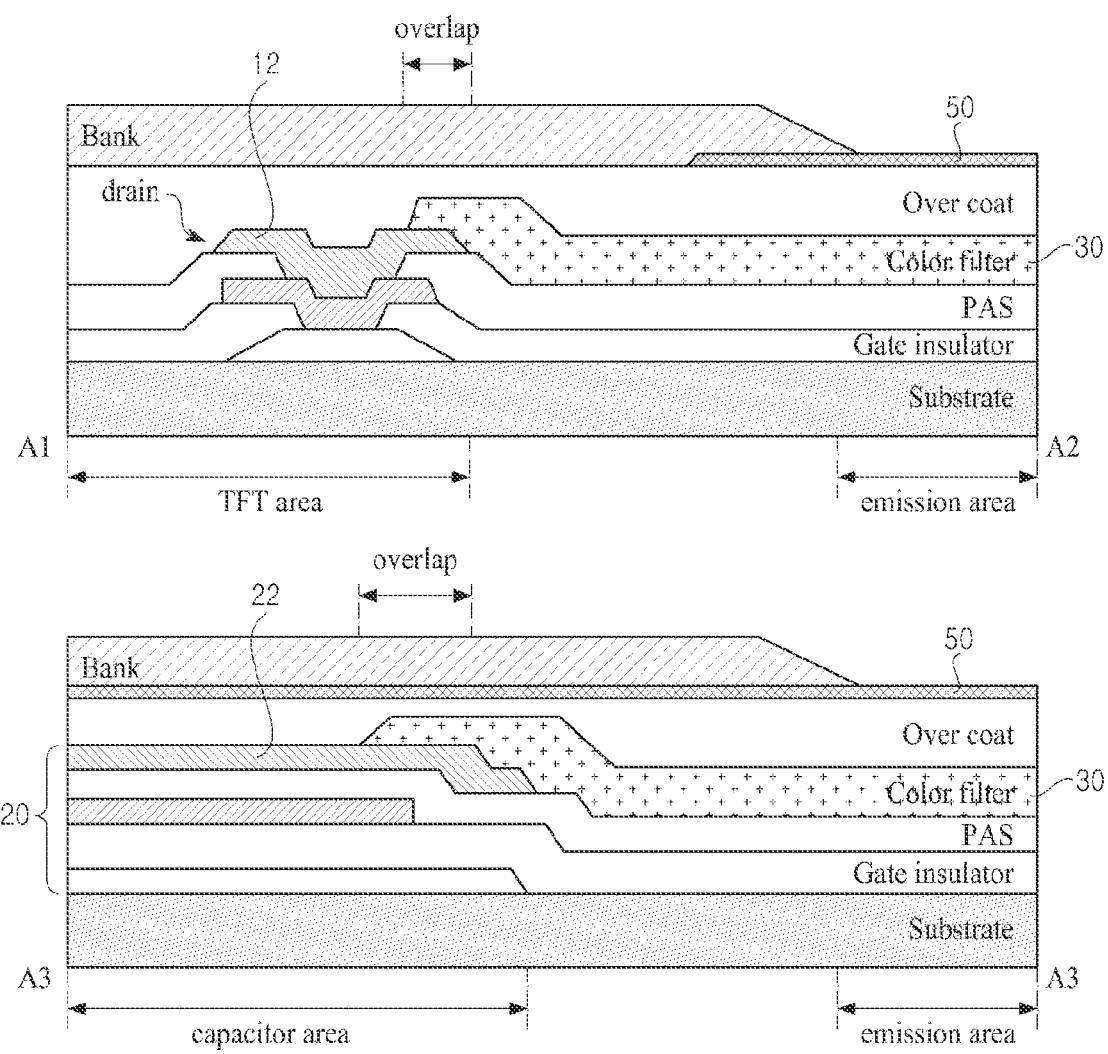
FIG. 2 is a cross-sectional view taken along line A1-A2 of FIG. 1 and a cross-sectional view taken along line A3-A4 of FIG. 1.

Reference will now be made in detail to the exemplary embodiments of the present disclosure, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

In description of embodiments of the present disclosure, when a structure (for example, an electrode, a line, a wiring, a layer, or a contact) is described as being formed at an upper portion/lower portion of another structure or on/under the other structure, this description should be construed as including a case where the structures contact each other and moreover a case where a third structure is disposed therebetween.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Before providing a description with reference to the drawings, the main feature of the present disclosure is the changing of a design of each sub-pixel so as to prevent a driving TFT from being short-circuited with a storage capacitor by a color filter formed of a color pigment containing a conductive material. Therefore, contents not directly related to the main feature of the present disclosure may not be illustrated or described to preserve clarity.

Organic light emitting diodes (OLEDs) are categorized into top emission type OLEDs and bottom emission type OLEDs depending on a light-transmitting direction. In the present disclosure, the bottom emission type OLED will be described as an example.

Figure 4:
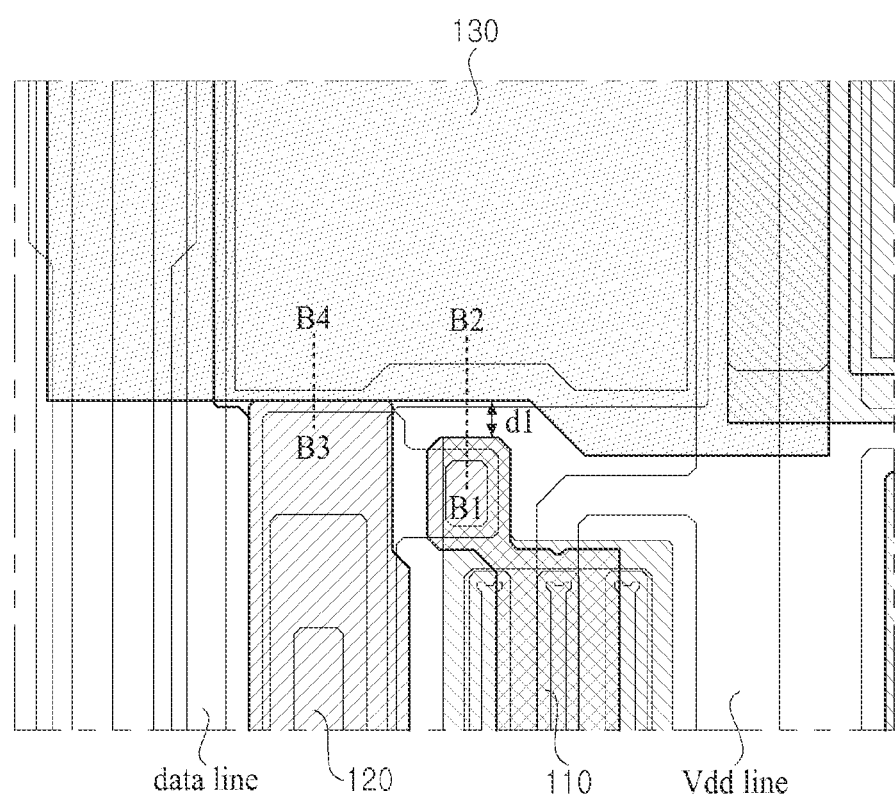
FIG. 4 is a view schematically illustrating a pixel structure of an organic light emitting display device according to a first embodiment of the present disclosure.
Figure 5:
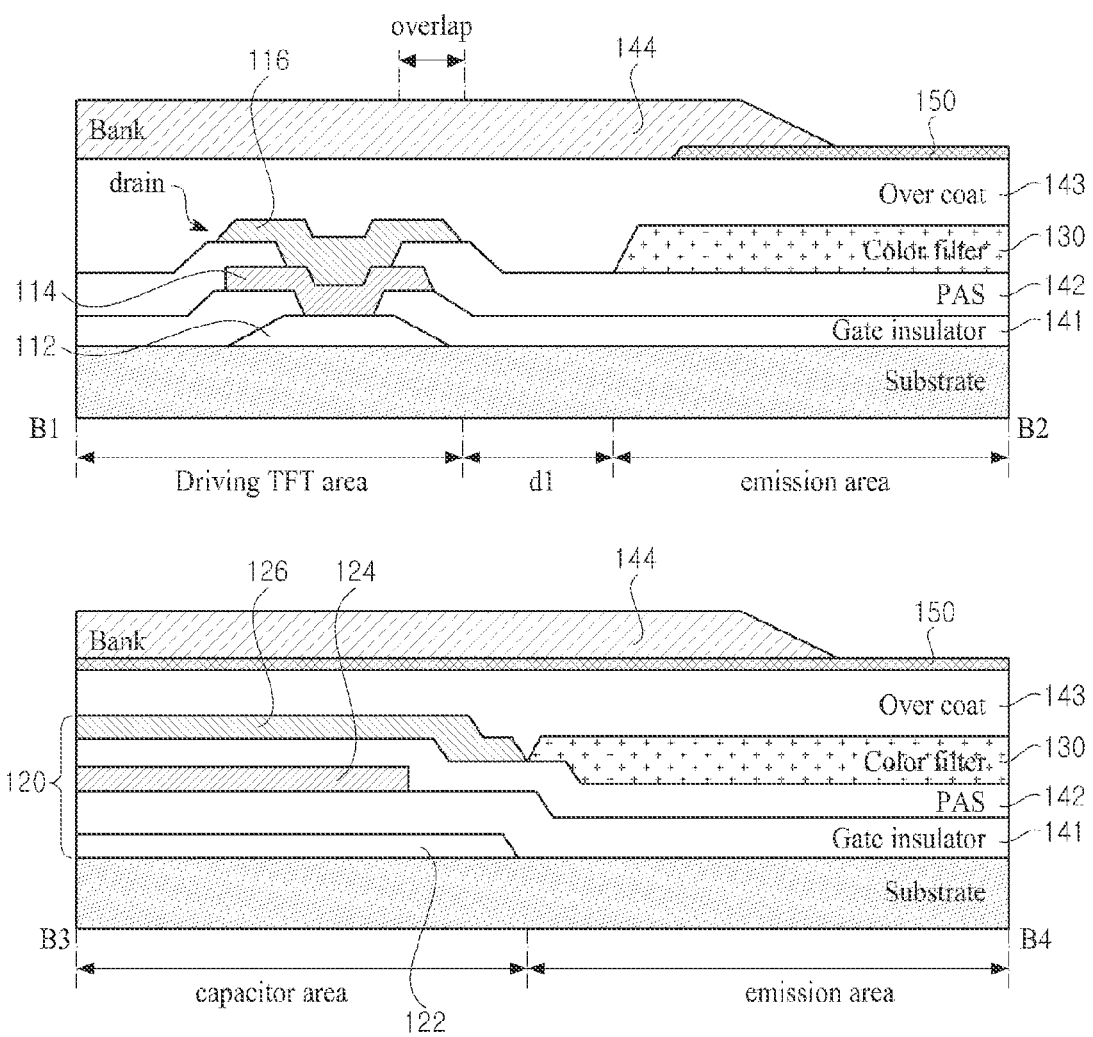
FIG. 5 is a cross-sectional view taken along line B1-B2 of FIG. 4 and a cross-sectional view taken along line B3-B4 of FIG. 4.

FIG. 4 is a view schematically illustrating a pixel structure of an organic light emitting display device according to a first embodiment of the present disclosure, and FIG. 5 is a cross-sectional view taken along line B1-B2 of FIG. 4 and a cross-sectional view taken along line B3-B4 of FIG. 4.

Referring to FIGS. 4 and 5, a plurality of pixels are formed in a matrix type on a display panel, and one unit pixel is composed of red (R), green (G), and blue (B) sub-pixels (sub-pixels of three colors) or R, G, B, and white (W) sub-pixels (sub-pixels of four colors).

Each of the sub-pixels includes a driving circuit that drives the white OLED. The driving circuit includes a driving TFT 110 and a storage capacitor 120, which control emission of light from the white OLED, and a plurality of switching TFTs (not shown).

As illustrated in FIG. 4, a first terminal of the storage capacitor 120 is coupled (connected) to a gate electrode of the driving TFT 110, and a second terminal of the storage capacitor 120 is coupled to an anode electrode of the white OLED. That is, the first terminal of the storage capacitor 120 is coupled to the gate electrode of the driving TFT 110, and the second terminal of the storage capacitor 120 is coupled to a source electrode of the driving TFT 110.

Here, each of the TFTs is an N-type TFT, and may be an a-Si TFT, a poly-Si TFT, an oxide TFT, or an organic TFT. However, the TFTs are not limited thereto, and for example, the TFTs may be formed as a P type.

The driving TFT 110 and the plurality of switching TFTs (not shown) are formed in a dual-gate structure that includes a lower gate, a source electrode, a drain electrode, and an upper gate. In FIG. 5, a drain of the driving TFT and the storage capacitor are illustrated, but an active layer and a source electrode are not illustrated.

A plurality of driving power lines (Vdd line), a plurality of data lines, a plurality of scan lines (not shown), and a plurality of reference power lines (not shown) are formed in the display panel.

The plurality of scan lines may be formed in a first direction (for example, a horizontal direction) in the display panel. Here, a scan signal is applied from a gate driver to the plurality of scan lines.

The plurality of data lines may be formed in a second direction (for example, a vertical direction) to intersect the plurality of scan lines. Here, data voltages (Vdata) are respectively supplied from a data driver to the plurality of data lines.

Each of the switching TFTs is turned on according to the scan signal, and supplies a data voltage, applied from a corresponding data line, to a corresponding driving TFT (for example, the driving TFT 110).

The driving TFT 110 is turned on with a data voltage supplied from a switching TFT corresponding thereto, and controls a data current (Ioled) which flows from a driving voltage VDD terminal to the OLED through a corresponding driving power line.

Figure 3:
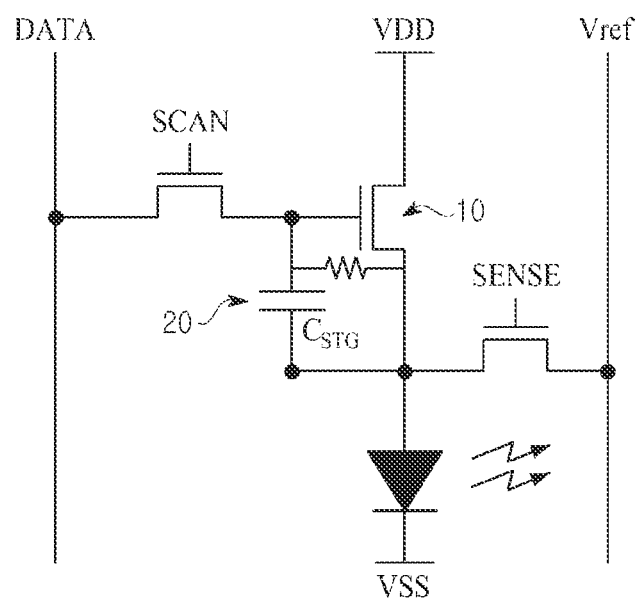
FIG. 3 is a circuit diagram for describing a problem that a drain of a driving TFT is short-circuited with a storage capacitor by a color filter.

As illustrated in FIG. 3, a data current flows from the driving voltage VDD terminal to a ground voltage VSS terminal via the driving TFT, and the white OLED is electrically coupled between the driving voltage VDD terminal and the ground voltage VSS terminal, and emits light with the data current supplied from the driving TFT 110.

Referring again to FIG. 5, a gate metal 112 is formed in a TFT area on a substrate, and a gate insulator (GI) 141 is formed on the gate metal 112. The gate metal 112 and the gate electrode of the driving TFT 110 are formed on the same layer.

The gate metal 112 may be formed of a single layer or a multi-layer, and may be formed to a thickness of 340 nm to 370 nm.

The gate insulator 141 may be formed of SiO2 or SiNx, and may be formed to a thickness of 400 nm to 430 nm. As another example, the gate insulator 141 may be formed in a multi-layer structure where an insulating layer formed of SiO2 and an insulating layer formed of SiNx overlap each other.

The active layer (not shown) is formed on the gate insulator 141, and the source electrode (not shown) and a drain metal 114 are formed on the active layer.

The drain metal 114 may be formed of a single layer or a multi-layer, and may be formed to a thickness of 420 nm to 450 nm.

In FIG. 5, since the drain electrode and the storage capacitor are illustrated, the active layer is not illustrated.

A passivation layer (PAS) 142 is formed on the source electrode and the drain electrode, and a top metal 116 is formed on the passivation layer 142.

The passivation layer 142 may be formed of SiO2 or SiNx, and may be formed to a thickness of 450 nm.

Here, the drain electrode is formed in an island shape, and the gate metal 112, the drain metal 114, and the top metal 116 are electrically coupled to each other. A portion of the gate insulator 141, corresponding to a portion in which the gate metal 112 and the drain metal 114 overlap each other, is removed, and thus, the gate metal 112 is coupled to the drain metal 114. A portion of the passivation layer 142, corresponding to a portion in which the drain metal 114 and the top metal 116 overlap each other, is removed, and thus, the drain metal 114 is coupled to the top metal 116.

The gate metal 112, drain metal 114, and top metal 116 of the driving TFT may be formed of a conductive material such as Cu or a copper alloy, Al or an aluminum alloy, Ag or a silver alloy, Au or a gold alloy, Mo or a molybdenum alloy, or Ti or a titanium alloy.

Ca, Mg, Zn, Mn, Ti, Mo, Ni, Zr, Cd, Ag, Au, Co, In, Ta, Hf, W, or Cr may be used as an alloy material of Cu, Al, Ag, Au, Mo, or Ti.

A first electrode 122 of the storage capacitor 120 is formed in a capacitor area on the substrate, and the gate insulator 141 is formed on the first electrode 122. The first electrode 122 of the storage capacitor 120 and the gate electrode and gate metal 112 of the driving TFT 110 are formed on the same layer.

A second electrode 124 of the storage capacitor 120 is formed on the gate insulator 141. The second electrode 124 of the storage capacitor 120 and the drain electrode of the driving TFT 110 are formed on the same layer.

The passivation layer (PAS) 142 is formed on the second electrode 124, and a third electrode 126 of the storage capacitor 120 is formed on the passivation layer 142. The third electrode 126 of the storage capacitor 120 and the top metal 116 of the driving TFT 110 are formed on the same layer.

The first to third electrodes 122, 124 and 126 of the storage capacitor 120 may be formed of a conductive material such as Cu or a copper alloy, Al or an aluminum alloy, Ag or a silver alloy, Au or a gold alloy, Mo or a molybdenum alloy, or Ti or a titanium alloy.

Ca, Mg, Zn, Mn, Ti, Mo, Ni, Zr, Cd, Ag, Au, Co, In, Ta, Hf, W, or Cr may be used as an alloy material of Cu, Al, Ag, Au, Mo, or Ti.

Subsequently, the gate insulator 141 and the passivation layer 142 are formed in the emission area, and the color filter 130 is formed on the passivation layer 142. The color filter 130 may be formed of red, green, and blue pigments, and may be formed to a thickness of 2.0 μm.

An overcoat layer 143 for planarizing the substrate is formed on the driving TFT 110, the storage capacitor 120, and the color filter 130, and a bank 144 defining an emission area is formed on the overcoat layer. Although not described, the plurality of switching TFTs may be formed in the same structure as that of the driving TFT 110.

The overcoat layer 143 may be formed of photoarcyl, and may be formed to a thickness of 2.0 μm to 3.0 μm.

The bank 144 may be formed of polyimide, and may be formed to a thickness of 1.8 μm. As another example, the bank 144 may be formed of a benzocyclobutene (BCB)-based resin or an acrylic-based resin. The white OLED is formed in the emission area defined by the bank 144.

An anode electrode 150 and the white OLED (not shown) are formed in the emission area of each sub-pixel, and a cathode electrode (not shown) is formed all over the substrate. The white OLED is formed in a structure where a hole injection layer, a hole transport layer, an organic emission layer, an electron injection layer, and an electron transport layer are stacked. The organic emission layer is formed between the hole transport layer and the electron transport layer.

The drain electrode of the driving TFT 110 and the anode electrode 150 are electrically coupled to each other through a contact (not shown). The white OLED is formed on the anode electrode 150, and the cathode electrode is formed on the white OLED.

In the bottom emission type, the anode electrode 150 may be formed of a transparent conductive material such as indium tin oxide (ITO), indium zinc oxide (IZO), or indium tin zinc oxide (ITZO), and may be formed to a thickness of 120 nm. The cathode electrode may be formed of a conductive material that reflects light.

Referring again to FIG. 4, In order to display a full-color image, a red color filter, a green color filter, and a blue color filter 130 are formed in each sub-pixel of a lower substrate (a TFT array substrate).

The color filter 130 includes a conductive material, and particularly, since the green color filter includes copper, a low electrical resistance is generated. Whether the white OLED excessively emits light due to the electrical resistance of the color filter was experimented. Referring to the following Table 1, when the resistance of the color filter is equal to or less than 1 TΩ, the leakage current can flow in the top metal of the storage capacitor and the top metal of the driving TFT.

TABLE 1

| | Color Filter Resistance | | | | |
|---|---|---|---|---|---|
| | 1 G[ohm] | 10 G[ohm] | 100 G[ohm] | 1 T[ohm] | 10 T[ohm] |
| Leakage Current | 1.0 [uA] | 1.02 [uA] | 0.9 [uA] | 60 [nA] | — |

In the organic light emitting display device according to the first embodiment of the present disclosure, the top metal 116 of the driving TFT 110 and the color filter 130 are formed to be separated from each other by a certain distance dl, for preventing the driving TFT 110 from being short-circuited with the storage capacitor 120 by the color filter 130 having a low electrical resistance. That is, the top metal 116 of the driving TFT 110 and the color filter 130 are formed to not overlap each other. Here, the top metal 116 of the driving TFT 110 and the color filter 130 may be formed to be separated from each other by a distance dl of 9.5 μm.

Moreover, the third electrode 126 (which is the top metal of the storage capacitor 120) and the color filter 130 are formed to be separated from each other by a certain distance, for preventing the driving TFT 110 from being short-circuited with the storage capacitor 120 by the color filter 130 having a low electrical resistance. That is, the top metal of the storage capacitor 120 and the color filter 130 are formed to not overlap each other.

The present disclosure changes a size of the color filter which covers a portion of the top metal of the driving TFT in the related art, and thus, the top metal 116 of the driving TFT 110 does not overlap the color filter 130. In this case, the size of the color filter is reduced by designing a mask for the color filter 130.

Moreover, the present disclosure changes a size of the color filter which covers a portion of the top metal of the storage capacitor in the related art, and thus, the third electrode 126 (which is the top metal of the storage capacitor 120) does not overlap the color filter 130.

Here, the size of the color filter is reduced by designing a mask for the color filter 130. In this case, the color filter 130 does not overlap the top metal of the driving TFT 110 and the top metal of the storage capacitor 120, thereby reducing the size of the color filter 130. However, by adjusting the size of the color filter 130, a reduction in an aperture ratio is minimized.

As described above, the top metal of each of the driving TFT 110 and storage capacitor 120 and the color filter 130 are formed to not overlap each other, thus preventing the driving TFT 110 from being short-circuited with the storage capacitor 120 by the color filter 130 having a low electrical resistance.

If the driving TFT 110 is not short-circuited with the storage capacitor 120, a resistance is maintained, and thus, the gate-source voltage Vgs of the driving TFT 110 is fixed. Accordingly, a leakage current does not flow. As a result, the leakage current does not flow during the non-emission period, and the white OLED does not excessively emit light.

Hereinabove, the bottom emission type has been described as an example, but the present disclosure is not limited thereto. Even when the top emission type is applied, the top metal of each of the driving TFT 110 and storage capacitor 120 and the color filter 130 may not overlap each other.

Hereinabove, the green sub-pixel has been described as an example, but the present disclosure is not limited thereto. As another example, when a resistance of a color filter is equal to or less than 1 TΩ, in addition to the green color filter, the red color filter and the blue color filter may not overlap the top metal of each of the driving TFT 110 and storage capacitor 120.

If a color filter overlaps a metal, a parasitic capacitance can be generated. Therefore, as in the present disclosure, if the top metal of each of the driving TFT 110 and storage capacitor 120 and the color filter 130 are formed to not overlap each other, the parasitic capacitance can be reduced.

Figure 6:
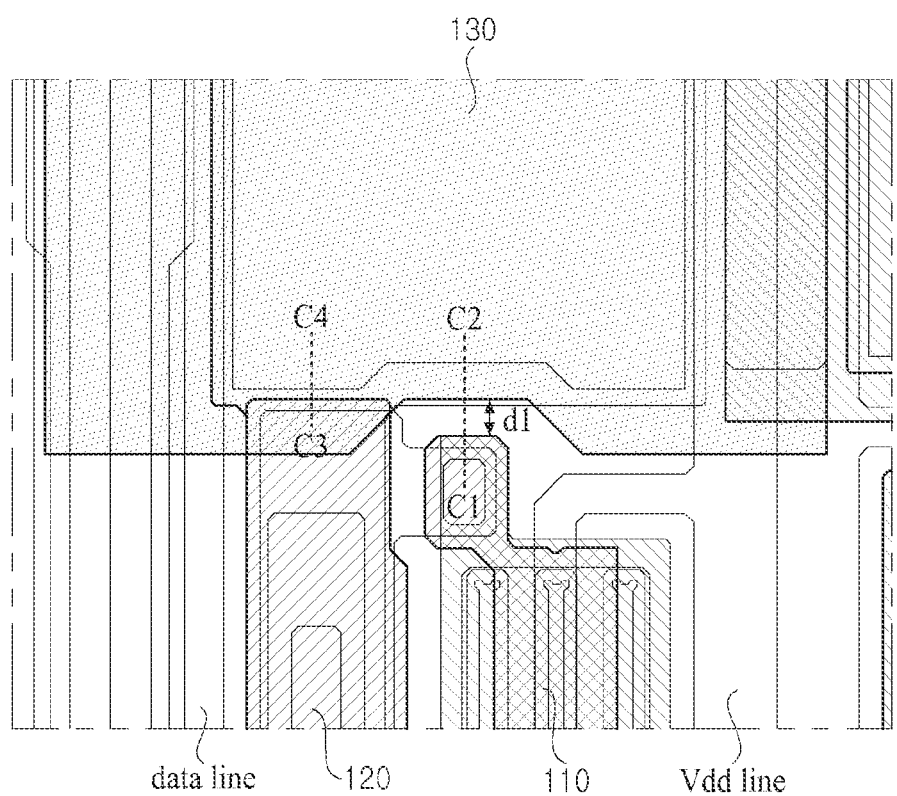
FIG. 6 is a view schematically illustrating a pixel structure of an organic light emitting display device according to a second embodiment of the present disclosure.
Figure 7:
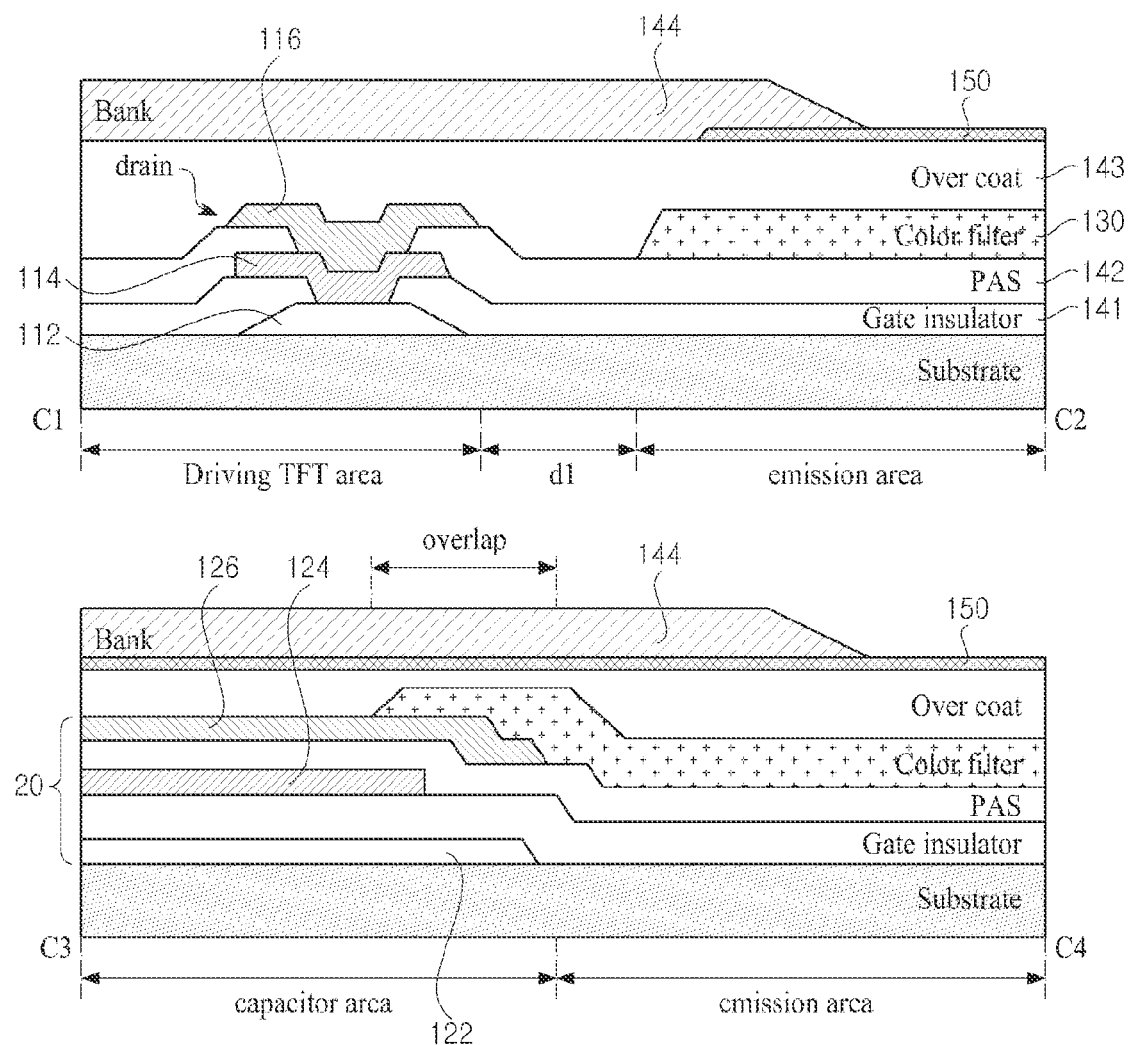
FIG. 7 is a cross-sectional view taken along line C1-C2 of FIG. 6 and a cross-sectional view taken along line C3-C4 of FIG. 6.

FIG. 6 is a view schematically illustrating a pixel structure of an organic light emitting display device according to a second embodiment of the present disclosure, and FIG. 7 is a cross-sectional view taken along line C1-C2 of FIG. 6 and a cross-sectional view taken along line C3-C4 of FIG. 6.

Referring to FIGS. 6 and 7, a plurality of pixels are formed in a matrix type on a display panel, and one unit pixel is composed of red (R), green (G), and blue (B) sub-pixels (sub-pixels of three colors) or R, G, B, and white (W) sub-pixels (sub-pixels of four colors).

Each of the sub-pixels includes a white OLED and a driving circuit that drives the white OLED. The driving circuit includes a driving TFT 110 and a storage capacitor 120, which control emission of light from the white OLED, and a plurality of switching TFTs (not shown).

The driving TFT 110 and the plurality of switching TFTs (not shown) are formed in a dual-gate structure that includes a lower gate, a source electrode, a drain electrode, and an upper gate. In FIG. 7, a drain of the driving TFT 110 and the storage capacitor 120 are illustrated, but an active layer and a source electrode are not illustrated.

A data current flows from the driving voltage VDD terminal to a ground voltage VSS terminal via the driving TFT 110, and the white OLED is electrically coupled between the driving voltage VDD terminal and the ground voltage VSS terminal, and emits light with the data current supplied from the driving TFT 110.

A gate metal 112 is formed in a TFT area on a substrate, and a gate insulator (GI) 141 is formed on the gate metal 112. The gate metal 112 and the gate electrode of the driving TFT 110 are formed on the same layer.

The gate metal 112 may be formed of a single layer or a multi-layer, and may be formed to a thickness of 340 nm to 370 nm.

The gate insulator 141 may be formed of SiO2 or SiNx, and may be formed to a thickness of 400 nm to 430 nm. As another example, the gate insulator 141 may be formed in a multi-layer structure where an insulating layer formed of SiO2 and an insulating layer formed of SiNx overlap each other.

The active layer (not shown) is formed on the gate insulator 141, and the source electrode (not shown) and a drain metal 114 are formed on the active layer.

The drain metal 114 may be formed of a single layer or a multi-layer, and may be formed to a thickness of 400 nm to 450 nm.

In FIG. 7, since the drain electrode and the storage capacitor are illustrated, the active layer is not illustrated.

A passivation layer (PAS) 142 is formed on the source electrode and the drain electrode, and a top metal 16 is formed on the passivation layer 142.

The passivation layer 142 may be formed of $SiO_2$ or SiNx, and may be formed to a thickness of 400 nm.

Here, the drain electrode is formed in an island shape, and the gate metal 112, the drain metal 114, and the top metal 116 are electrically coupled to each other. A portion of the gate insulator 141, corresponding to a portion in which the gate metal 112 and the drain metal 114 overlap each other, is removed, and thus, the gate metal 112 is coupled to the drain metal 114. A portion of the passivation layer 142, corresponding to a portion in which the drain metal 114 and the top metal 116 overlap each other, is removed, and thus, the drain metal 114 is coupled to the top metal 116.

A first electrode 122 of the storage capacitor 120 is formed in a capacitor area on the substrate, and the gate insulator 141 is formed on the first electrode 122. The first electrode 122 of the storage capacitor 120 and the gate electrode and gate metal 112 of the driving TFT 110 are formed on the same layer.

A second electrode 124 of the storage capacitor 120 is formed on the gate insulator 141. The second electrode 124 of the storage capacitor 120 and the drain electrode of the driving TFT 110 are formed on the same layer.

The passivation layer (PAS) 142 is formed on the second electrode 124, and a third electrode 126 of the storage capacitor 120 is formed on the passivation layer 142. The third electrode 126 of the storage capacitor 120 and the top metal 116 of the driving TFT 110 are formed on the same layer.

Subsequently, the gate insulator 141 and the passivation layer 142 are formed in the emission area, and the color filter 130 is formed on the passivation layer 142. The color filter 130 may be formed of red, green, and blue pigments, and may be formed to a thickness of 2.0 µm.

An overcoat layer 143 for planarizing the substrate is formed on the driving TFT 110, the storage capacitor 120, and the color filter 130, and a bank 144 defining an emission area is formed on the overcoat layer. Although not described, the plurality of switching TFTs may be formed in the same structure as that of the driving TFT 110.

The overcoat layer 143 may be formed of photoarcyl, and may be formed to a thickness of 2.0 µm to 3.0 µm.

The bank 144 may be formed of polyimide, and may be formed to a thickness of 1.8 µm. As another example, the bank 144 may be formed of a benzocyclobutene (BCB)-based resin or an acrylic-based resin. The white OLED is formed in the emission area defined by the bank 144.

An anode electrode 150 and the white OLED (not shown) are formed in the emission area of each sub-pixel, and a cathode electrode (not shown) is formed all over the substrate.

The drain electrode of the driving TFT 110 and the anode electrode 150 are electrically coupled to each other through a contact (not shown). The white OLED is formed on the anode electrode 150, and the cathode electrode is formed on the white OLED.

In the bottom emission type, the anode electrode 150 may be formed of a transparent conductive material such as indium tin oxide (ITO), indium zinc oxide (IZO), or indium tin zinc oxide (ITZO), and may be formed to a thickness of 120 nm. The cathode electrode 170 may be formed of a conductive material that reflects light.

The white OLED (not shown) emits white light from an organic material layer. In order to display a full-color image, a red color filter, a green color filter, and a blue color filter 130 are formed in each sub-pixel of a lower substrate (a TFT array substrate).

In the organic light emitting display device according to the second embodiment of the present disclosure, the top metal 116 of the driving TFT 110 and the color filter 130 are formed to be separated from each other by a certain distance dl, for preventing the driving TFT 110 from being short-circuited with the storage capacitor 120 by the color filter 130 having a low electrical resistance.

That is, the top metal 116 of the driving TFT 110 and the color filter 130 are formed to not overlap each other. Here, the top metal 116 of the driving TFT 110 and the color filter 130 may be formed to be separated from each other by a distance dl of 9.5 µm. In this case, the top metal of the storage capacitor 120 and the color filter 130 may be formed to partially overlap each other.

The present disclosure changes a size of the color filter which covers a portion of the top metal of the driving TFT in the related art, and thus, the top metal 116 of the driving TFT 110 does not overlap the color filter 130. In this case, the size of the color filter is reduced by designing a mask for the color filter 130.

The top metal of the driving TFT 110 and the color filter 130 do not overlap each other, thereby preventing the driving TFT 110 from being short-circuited with the storage capacitor 120 by the color filter 130 having a low resistance.

Although the color filter 130 and the top metal of the storage capacitor 120 partially overlap each other, the top metal of the driving TFT 110 and the color filter 130 do not overlap each other, thereby preventing the driving TFT 110 from being short-circuited with the storage capacitor 120.

If the driving TFT 110 is not short-circuited with the storage capacitor 120, a resistance is maintained, and thus, the gate-source voltage Vgs of the driving TFT 110 is fixed. Accordingly, a leakage current does not flow. As a result, the leakage current does not flow during the non-emission period, and the white OLED does not excessively emit light.

As described above, the organic light emitting display device according to the embodiments of the present disclosure can prevent the driving TFT from being short-circuited with the storage capacitor.

Moreover, the organic light emitting display device according to the embodiments of the present disclosure can prevent the OLED from emitting light during the non-emission period.

Moreover, in the organic light emitting display device according to the embodiments of the present disclosure, the top metal of each of the driving TFT and storage capacitor and the color filter are formed to not overlap each other, thus reducing a parasitic capacitance.

In addition to the aforesaid features and effects of the present disclosure, other features and effects of the present disclosure can be newly construed from the embodiments of the present disclosure.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting display device comprising:
   a substrate;
   a white organic light emitting diode (OLED) on the substrate in an emission area of each of a plurality of sub-pixels;
   a driving thin film transistor (TFT) on the substrate, the TFT configured to supply a driving current to the white OLED;
   a storage capacitor on the substrate, the storage capacitor configured to comprise a first terminal, which is coupled to the driving TFT, and a second terminal coupled to an anode electrode of the white OLED, the storage capacitor including:
      a first electrode formed on the substrate, wherein the first electrode is in the same layer as a gate electrode of the driving TFT;
      a gate insulator formed on the first electrode;
      a second electrode formed on the gate insulator, wherein the second electrode is in the same layer as a drain electrode of the driving TFT;
      a passivation layer formed on the second electrode; and
      a third electrode formed on the passivation layer, wherein the third electrode is in the same layer as a top metal of the driving TFT; and
   a color filter formed in the emission area,
   wherein the first, second, and third electrodes of the storage capacitor do not overlap and do not underlap the color filter in a lateral direction of the substrate.

2. The organic light emitting display device of claim 1, wherein a resistance of the color filter is greater than 1 [GΩ] but less than 1 [TΩ].

3. The organic light emitting display device of claim 1, wherein the color filter and the top metal of the driving TFT are formed with an interval of 9.5 μm therebetween.

4. The organic light emitting display device of claim 1, wherein the color filter is at least one of a green color filter formed of a green pigment, a red color filter formed of a red pigment, and a blue color filter formed of a blue pigment.

5. The organic light emitting display device of claim 1, wherein the driving TFT is formed in a dual-gate structure that includes a lower gate, a source electrode, the drain electrode, and an upper gate.

6. The organic light emitting display device of claim 1, wherein during a non-emission period, a gate-source voltage of the driving TFT is maintained, and a leakage current does not flow.

7. The organic light emitting display device of claim 1, wherein the color filter is formed of a pigment containing a conductive material.

8. An organic light emitting display device comprising:
   a substrate;
   a white organic light emitting diode (OLED) on the substrate in an emission area of each of a plurality of sub-pixels;
   a driving thin film transistor (TFT) on the substrate, the TFT configured to supply a driving current to the white OLED;
   a storage capacitor on the substrate, the storage capacitor configured to comprise a first terminal, which is coupled to the driving TFT, and a second terminal coupled to an anode electrode of the white OLED, the storage capacitor including:
      a first electrode formed on the substrate, wherein the first electrode is in the same layer as a gate electrode of the driving TFT;
      a gate insulator formed on the first electrode;
      a second electrode formed on the gate insulator, wherein the second electrode is in the same layer as a drain electrode of the driving TFT;
      a passivation layer formed on the second electrode; and
      a third electrode formed on the passivation layer, wherein the third electrode is in the same layer as a top metal of the driving TFT; and
   a color filter formed in the emission area,
   wherein the top metal of the driving TFT and the first, second, and third electrodes of the storage capacitor do not overlap and do not underlap the color filter in a lateral direction of the substrate.

* * * * *